(12) United States Patent
Nada et al.

(10) Patent No.: US 12,034,090 B2
(45) Date of Patent: Jul. 9, 2024

(54) SEMICONDUCTOR LIGHT RECEIVING ELEMENT

(71) Applicant: Nippon Telegraph and Telephone Corporation, Tokyo (JP)

(72) Inventors: Masahiro Nada, Musashino (JP); Toshihide Yoshimatsu, Musashino (JP); Fumito Nakajima, Musashino (JP); Yuki Yamada, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 396 days.

(21) Appl. No.: 17/440,666

(22) PCT Filed: Apr. 7, 2020

(86) PCT No.: PCT/JP2020/015616
§ 371 (c)(1),
(2) Date: Sep. 17, 2021

(87) PCT Pub. No.: WO2020/209243
PCT Pub. Date: Oct. 15, 2020

(65) Prior Publication Data
US 2022/0158008 A1    May 19, 2022

(30) Foreign Application Priority Data
Apr. 9, 2019  (JP) .................................. 2019-073929

(51) Int. Cl.
*H01L 31/0224*  (2006.01)
*H01L 31/0232*  (2014.01)
(Continued)

(52) U.S. Cl.
CPC ................ *H01L 31/022416* (2013.01); *H01L 31/02327* (2013.01); *H01L 31/03046* (2013.01); *H01L 31/103* (2013.01); *H01L 31/1844* (2013.01)

(58) Field of Classification Search
CPC ....... H01L 31/022416; H01L 31/02327; H01L 31/03046; H01L 31/103; H01L 31/1844; H01L 31/02161; H01L 31/105
See application file for complete search history.

(56) References Cited

U.S. PATENT DOCUMENTS 4,885,622 A     12/1989  Uchiyama et al.
2002/0056845 A1  5/2002  Iguchi et al.
(Continued)

FOREIGN PATENT DOCUMENTS

JP    H05-275732 A     10/1993
JP    H05275732 A   *  10/1993
(Continued)

OTHER PUBLICATIONS

Kazutoshi Kato, *Long-Wavelength Photodetectors for Ultrawide-Band Systems*, IEICE Trans. Electron., vol. E79-C, No. 1, Jan. 1996, pp. 14-20, XP000580153.
(Continued)

*Primary Examiner* — Sitaramarao S Yechuri
(74) *Attorney, Agent, or Firm* — Workman Nydegger (57) ABSTRACT

Provided is a semiconductor light receiving element which can achieve a high-speed operation without sacrificing light receiving sensitivity while increasing the margin of a manufacturing process. The semiconductor light receiving element according to the present invention is characterized by comprising: a semiconductor layer doped with a first impurity; a semiconductor light absorption layer in which a band gap energy is adjusted to absorb incident light on the (Continued)

semiconductor layer doped with the first impurity; a semiconductor layer on the semiconductor light absorption layer and doped with a second impurity; and a metal electrode contacting side surfaces of the semiconductor layer doped with the second impurity, wherein side surfaces of the metal electrode are surfaces parallel to a growth direction of the semiconductor layer doped with the second impurity.

8 Claims, 7 Drawing Sheets

(51) Int. Cl.
  *H01L 31/0304* (2006.01)
  *H01L 31/103* (2006.01)
  *H01L 31/18* (2006.01)

(56) References Cited

U.S. PATENT DOCUMENTS

| | | |
|---|---|---|
| 2009/0236504 A1 | 9/2009 | Yamaguchi |
| 2012/0160319 A1 | 6/2012 | Nakahata et al. |
| 2013/0248821 A1* | 9/2013 | Miura ................. H01L 27/1446 438/94 |
| 2014/0001592 A1* | 1/2014 | Yamabi ........... H01L 31/022416 257/466 |

FOREIGN PATENT DOCUMENTS

| | | |
|---|---|---|
| JP | H09-064407 A | 3/1997 |
| JP | 2002-151730 A | 5/2002 |
| JP | 2005-216874 A | 8/2005 |
| JP | 2010-141192 A | 6/2010 |

OTHER PUBLICATIONS

E. Yagyu et al., *Recent Advances in AlInsAs Avalanche Photodiodes*, in Proc. OFC2007, OThG2, pp. 1-3.

* cited by examiner

SEMICONDUCTOR LIGHT RECEIVING ELEMENT

TECHNICAL FIELD

The present invention relates to a semiconductor light-receiving element (photodiode (PD)), and particularly relates to an increase in speed and sensitivity of the semiconductor light-receiving element.

BACKGROUND ART

Semiconductor light-receiving elements have the function of converting an incident optical signal to an electrical signal. The semiconductor light-receiving elements are widely applied to optical communication such as optical receivers and photomixers for millimeter-wave oscillator.

Whether the performance of the semiconductor light-receiving element is superior is often discussed with light reception sensitivity and operating speed. This is because the semiconductor light-receiving element basically has a trade-off relationship between the sensitivity and the operating speed. In designing a semiconductor light-receiving element, the sensitivity and the operating speed are optimized according to the intended use of the semiconductor light-receiving element.

There is a trade-off relationship between the sensitivity and the operating speed of the semiconductor light-receiving element. This is associated mainly with two points, a thickness of light-absorbing layer and an operating area.

As the thickness of a light-absorbing layer increases, signal light incident to the semiconductor light-receiving element passes through the light-absorbing layer by a longer distance (optical path length). Meanwhile, electrons and positive holes (carriers) generated in the light-absorbing layer need to run a longer distance before reaching an electrode. For this reason, as the thickness of the light-absorbing layer increases, the light reception sensitivity increases, while the operating speed decreases.

Meanwhile, as the operating area increases, incident light can be optically coupled with the semiconductor light-receiving element more easily. It is a general technique to focus signal light incident to a semiconductor light-receiving element by using a lens, to thereby achieve optical coupling with minimum loss to a semiconductor light-receiving element having a small operating area. However, although the lens is used, the spot size of the incident light can practically be only decreased to approximately m. An optical signal irradiated to the outside of the operating area is not converted to an electrical signal, thus resulting in loss from the viewpoint of light reception sensitivity. This causes a reduction in the light reception sensitivity. In contrast, from the viewpoint of operating speed, as the operating area is smaller, the capacitance of the element decreases. This relaxes the speed limit due to an RC time constant, and thus makes it possible for the semiconductor light-receiving element to operate at higher speed.

As described above, to achieve a semiconductor light-receiving element having high light reception sensitivity and capable of high-speed operation, the semiconductor light-receiving element is required to be designed to ensure a greater optical path length of signal light in the element, and increase the area that receives the signal light to a maximum possible extent, while decreasing the operating area. In view of this, a light-receiving element is proposed as illustrated in FIG. 1, and for example includes, on the top portion of the element, a ring-shaped electrode 106 when viewed from above, and a reflective mirror 105 (Non-Patent Literature 1).

Figure 1:
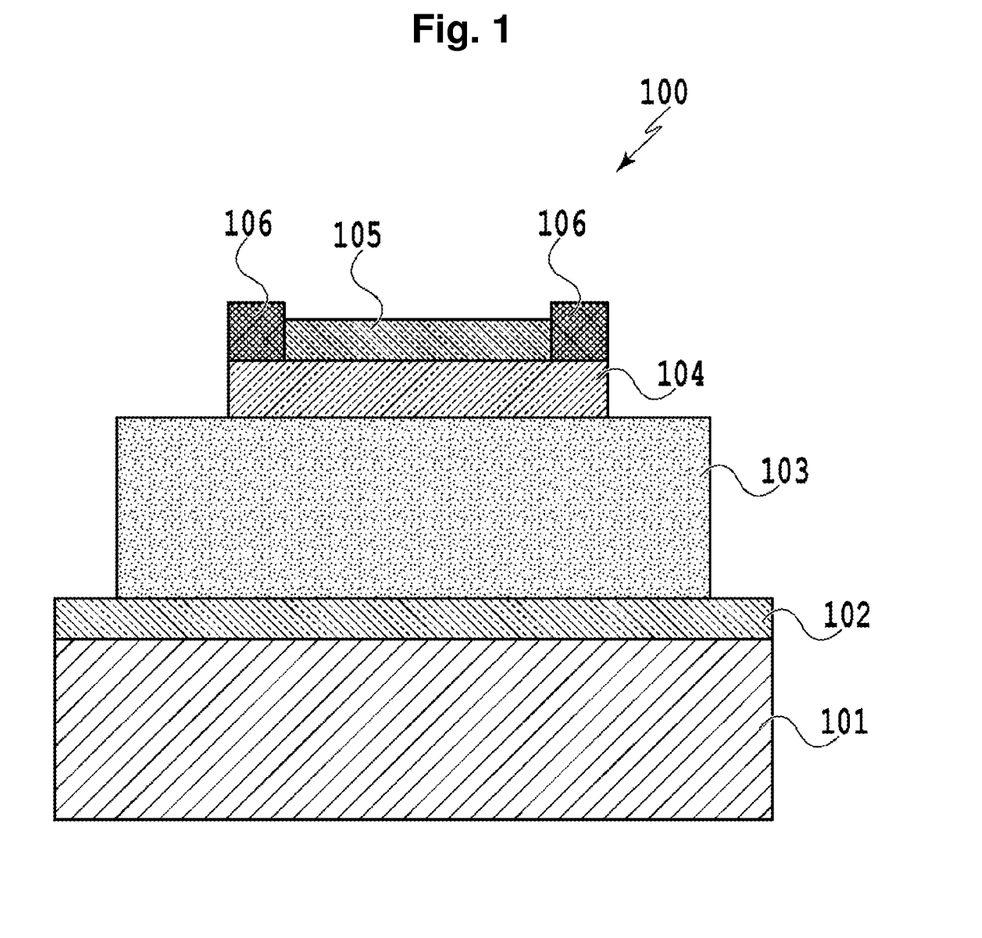
FIG. 1 illustrates a conventional semiconductor light-receiving element.

A semiconductor light-receiving element 100 illustrated in FIG. 1 has a layer structure in which a contact layer 102 containing p-type InP, a light-absorbing layer 103 containing undoped InGaAs, and a contact layer 104 containing n-type InP are laminated on an InP substrate 101 in the order described. The semiconductor light-receiving element 100 also has a multi-mesa structure in which the respective mesas of the contact layer 104 containing n-type InP, the light-absorbing layer 103 containing undoped InGaAs, and the contact layer 102 containing P-type InP increase gradually in outside dimensions in the order described, the contact layer 104 being an uppermost layer processed into the smallest mesa. On the top portion of the contact layer 104 of n-type, the reflective mirror 105 and the ring-shaped electrode 106 are formed. On the side of the reflective mirror 105 of n-type, the ring-shaped electrode 106 is formed. In the structure of the semiconductor light-receiving element 100 illustrated in FIG. 1, signal light is incident from the back side of the InP substrate 101 of the semiconductor light-receiving element 100, and is reflected off the reflective mirror 105 on the top portion of the element. Thus, the signal light travels back and forth through the light-absorbing layer 103 (2-pass structure) to increase the optical path length to improve the light reception sensitivity. Meanwhile, the ring-shaped electrode 106 (upper electrode) that draws a current has such a ring shape as to surround the reflective mirror 105.

The ring-shaped electrode 106 is typically formed from a laminated structure of Ti (lower layer), Pt (intermediate layer), and Au (upper layer) from the viewpoint of ohmic contact with the contact layer 102, heat resistance, and adhesion. In contrast, the reflective mirror 105 is made of Au to improve the reflectivity.

CITATION LIST

Non-Patent Literature

Non-Patent Literature 1: E. Yagyu et al. "Recent advances in AlInAs Avalanche Photodiodes," in Proc. OFC2007, OThG2.

SUMMARY OF THE INVENTION

Technical Problem

In FIG. 1, when incident light is irradiated to the ring-shaped electrode 106, the reflectivity of the contact layer 104 containing semiconductor, and metal of the ring electrode is lower than that of the reflective mirror 105. Consequently, the light reception sensitivity decreases compared to the case where incident light is reflected off a mirror portion.

Thus, in a semiconductor light-receiving element with a certain operating area, the width of a ring electrode needs to be decreased to ensure the light-receiving area as large as possible. However, as the width of the ring-shaped electrode 106 is decreased, a lithographic process margin in a step of manufacturing the element is reduced. Practically, this makes it difficult to manufacture the element. In addition, the contact area between the ring-shaped electrode (metal electrode) 106 and the contact layer 104 of semiconductor also decreases, and accordingly the contact resistance increases. There is thus a problem that since the operating speed is limited by the RC time constant, the operating speed is not likely to improve as expected.

As explained in Background Art, it is essential for a vertical-incidence semiconductor light-receiving element to ensure a large light-receiving area to increase the sensitivity as an optical receiver. For this reason, a ring-shaped electrode is used as an electrode located on the top portion of the element. However, when the element diameter is decreased to increase the operating speed, it is necessary to decrease the width of the ring. There is thus a problem in that it is difficult to ensure a process margin, the contact resistance increases, and consequently it is difficult to achieve high-speed operation with high sensitivity.

Means for Solving the Problem

The present invention has been made in view of the above problems with the conventional technique, and it is an object of the present invention to provide a semiconductor light-receiving element that increases a manufacturing process margin and achieves high-speed operation without sacrificing light reception sensitivity.

A semiconductor light-receiving element according to one aspect of the present invention includes: a semiconductor layer doped with first impurities; a semiconductor light-absorbing layer on the semiconductor layer doped with the first impurities, the semiconductor light-absorbing layer having bandgap energy adjusted to absorb incident light; a semiconductor layer doped with second impurities on the semiconductor light-absorbing layer; and a metal electrode that comes into contact with a side of the semiconductor layer doped with the second impurities, wherein the side of the metal electrode is a surface parallel to a growth direction of the semiconductor layer doped with the second impurities. Note that when the first impurities are P-type impurities, the second impurities are n-type impurities, and when the first impurities are n-type impurities, the second impurities are P-type impurities.

Effects of the Invention

The present invention has effects of increasing a manufacturing process margin, and achieving high-speed operation without sacrificing light reception sensitivity.

DESCRIPTION OF EMBODIMENTS

Hereinafter, a semiconductor light-receiving element according to embodiments of the present invention will be described in detail with reference to the drawings. However, the present invention is not limited to the descriptions of the embodiments to be described below. It is obvious to those skilled in the art that the modes and details can be variously changed without departing from the scope of the present invention disclosed in the specification and other documents of the present invention. Note that in the configuration of the invention to be described below, the same portions or portions having similar functions are denoted by the same reference signs, and repetitive descriptions thereof may be omitted.

First Embodiment

A first embodiment of the present invention is described below. The present embodiment is a basic embodiment of the present invention.

Figure 2:
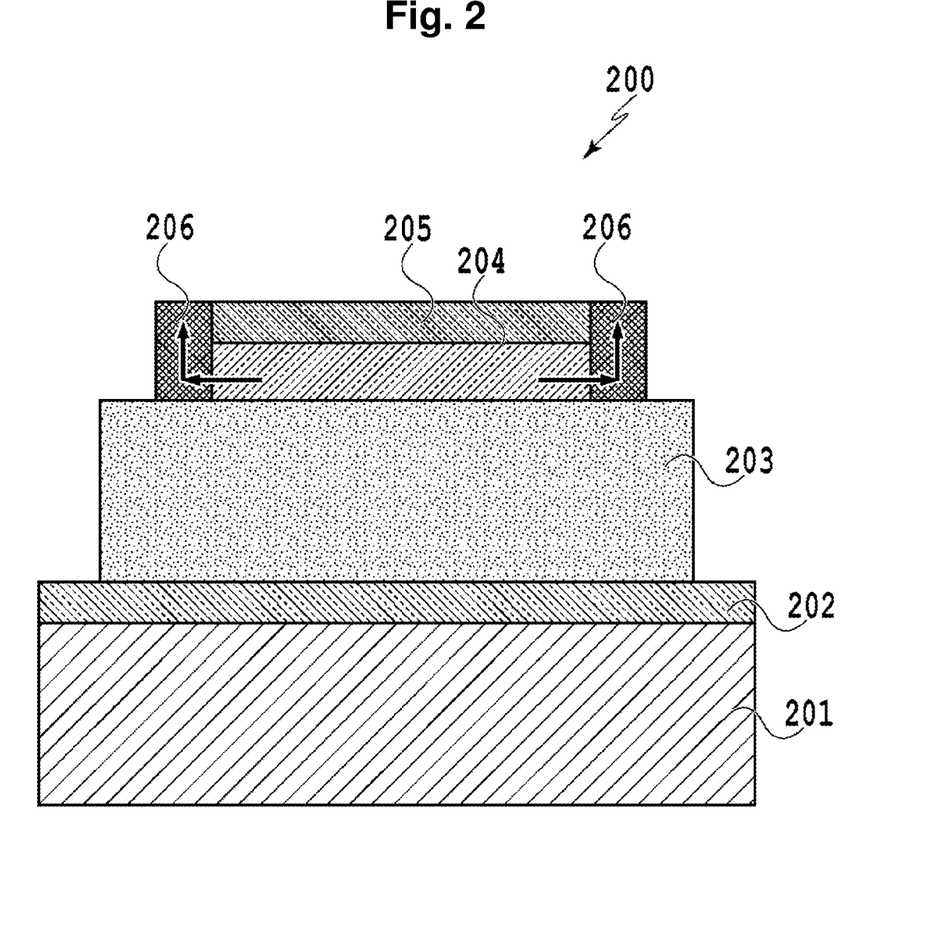
FIG. 2 illustrates a semiconductor light-receiving element according to a first embodiment of the present invention.

FIG. 2 is a cross-sectional view of a semiconductor light-receiving element 200 according to the first embodiment. In the present embodiment, the semiconductor light-receiving element 200 has a layer structure in which a contact layer 202 containing p-type InP, a light-absorbing layer 203 containing undoped InGaAs, and a contact layer 204 containing n-type InP are laminated on an InP substrate 201 in the order described. The semiconductor light-receiving element 200 also has a multi-mesa structure in which the respective mesas of the contact layer 204 containing n-type InP, the light-absorbing layer 203 containing undoped InGaAs, and the contact layer 202 containing P-type InP increase gradually in outside dimensions in the order described, the contact layer 204 being an uppermost layer processed into the smallest mesa.

On the top portion of the contact layer 204 of N-type, a reflective mirror film 205 is formed. On the side of the contact layer of n-type, a metal electrode 206 is formed and is in electrical contact with the side portion of the contact layer 204 containing n-type InP.

That is, a light-receiving element according to the first embodiment includes the contact layer 202 (semiconductor layer doped with impurities to be P-type), the light-absorbing layer 203 (semiconductor light-absorbing layer having bandgap energy adjusted to absorb incident light) on the contact layer 202, the contact layer 204 (semiconductor layer doped with impurities to be N-type) on the light-absorbing layer 203, and the metal electrode 206 that comes into contact with the side of the contact layer 204. The light-receiving element according to the first embodiment is characterized in that the side of the metal electrode 206 is a surface parallel to a growth direction of the contact layer 204.

The principles of operation of the light-receiving element according to the present embodiment are described below. Electrons, generated by photoexcitation in the light-absorbing layer 203 containing undoped InGaAs, reach the contact layer 204 of n-type, and thereafter move to the metal electrode 206 as a majority carrier. In a case where the mirror film 205 is made of metal, the electrons can also move to the mirror film 205 containing metal. However, in general, the mirror film 205 is required to have low reflectivity on a semiconductor-mirror interface, and it is not necessary to make a special effort to reduce the contact resistance on the semiconductor-mirror interface. Even if the resistance on the mirror-semiconductor interface increases, it suffices that the contact resistance between the semiconductor and the metal electrode can be reduced.

Figure 3:
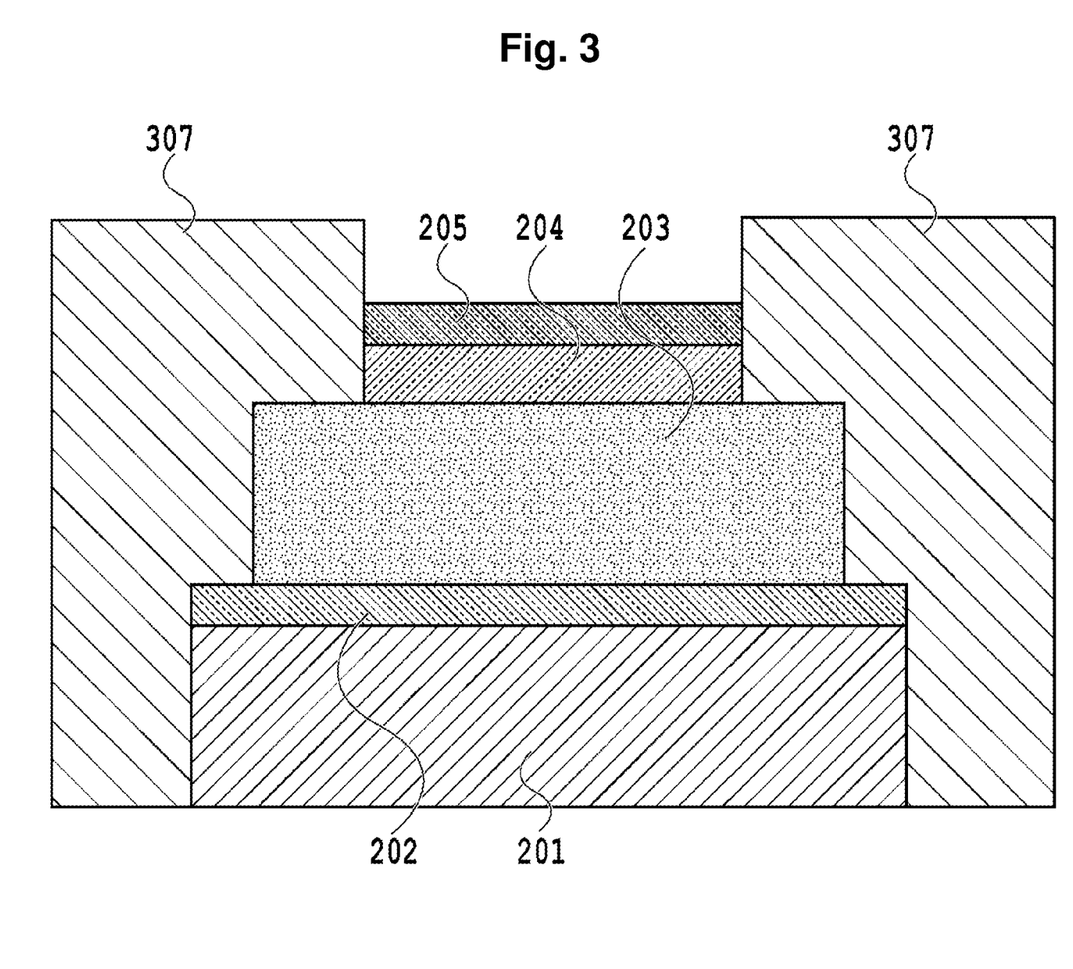
FIG. 3 illustrates a step of manufacturing the semiconductor light-receiving element according to the first embodiment of the present invention.
Figure 4:
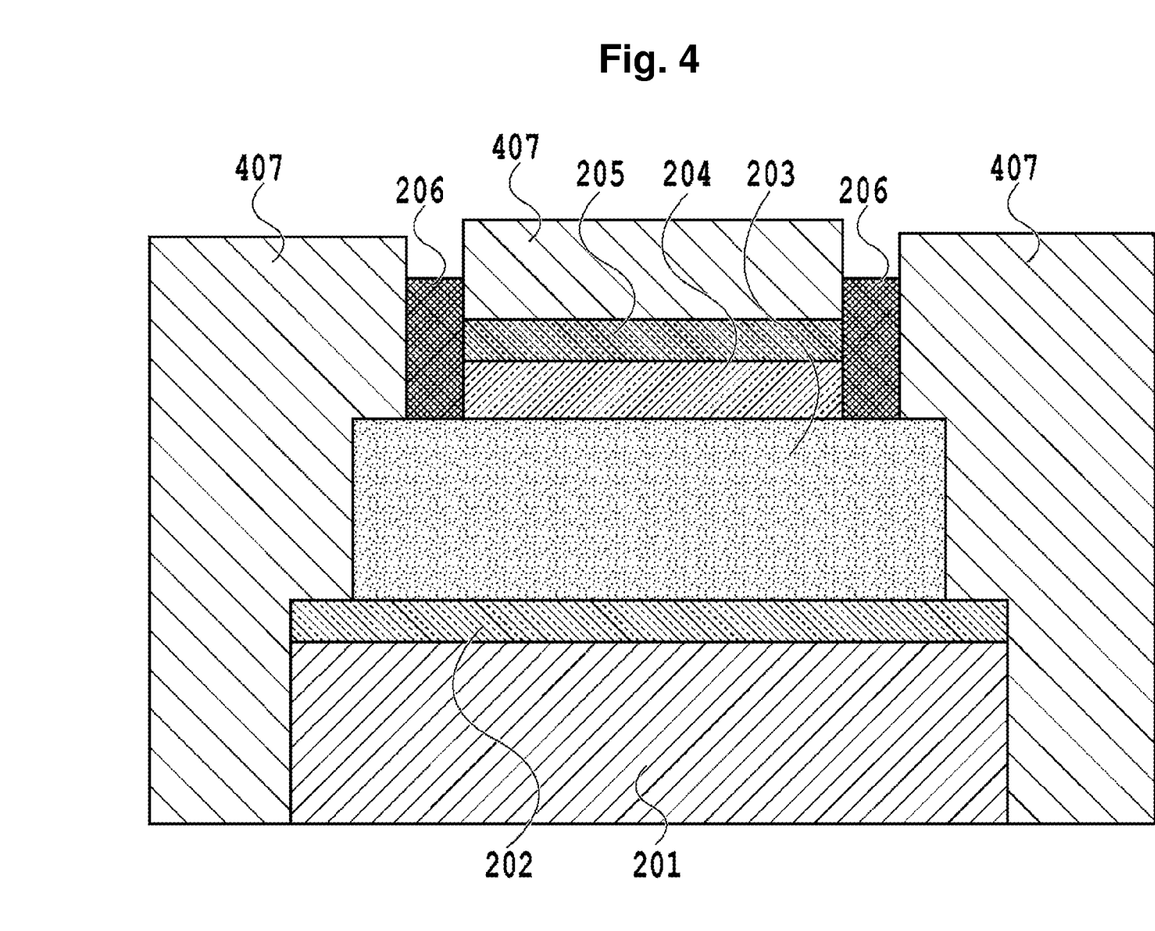
FIG. 4 illustrates a step of manufacturing the semiconductor light-receiving element according to the first embodiment of the present invention.

A manufacturing method according to the present embodiment is described below. As illustrated in FIG. 3, on the InP substrate 201 with semi-insulating properties, first the contact layer 202 containing p-type InP, the light-absorbing layer 203 containing undoped InGaAs, and the contact layer 204 containing n-type InP are epitaxially grown in the order described by using the MOCVD method. After crystal growth, photolithography and etching are performed sequentially such that the respective areas of the contact layer 204 of n-type, the light-absorbing layer 203 containing undoped InGaAs, and the contact layer 202 containing p-type InP gradually increase in the order described, the contact layer 204 becoming the smallest mesa. Subsequently, as illustrated in FIG. 3, a photoresist 307 formed by the photolithography is used to form the mirror film 205 containing metal by sputtering such that the mirror film 205 has the same size as the contact layer 204 of n-type. Thereafter, as illustrated in FIG. 4, the photoresist is removed, and patterning of a photoresist 407 is carried out by performing photolithography again to form a ring-shaped gap around the contact layer 204 of n-type at the center such that the outer circumference of the contact layer 204 of n-type is also an inner diameter of the ring-shaped gap. At this time, it suffices that the patterning is carried out such that the outer diameter of the ring-shaped gap is larger than that of the contact layer 204 of n-type by approximately 3 to 5 µm to form the metal electrode 206 in a ring-shaped gap portion by vapor deposition. Assuming that the metal electrode 206 has a layer structure of, for example, Ti, Pt, and Au, the metal electrode 206 can ensure high adhesion strength with semiconductor, while decreasing the contact resistance. A metal electrode is formed by performing vapor deposition with a wafer rotating by itself, so that the metal electrode can be formed on the side of the contact layer 204 of n-type more evenly.

The mirror film 205 containing metal and the metal electrode 206, which are illustrated in the present embodiment, do not impair the intended properties even though the mirror film 205 and the metal electrode 206 are in contact with each other. This is because electrons generated in the semiconductor light-receiving element 200 can be extracted from the contact layer 204 containing n-type InP through the metal electrode 206, and further through the mirror film 205 and the metal electrode 206 to an external circuit. Assuming that a mirror and an electrode are made of metal, the resistance of the metal is relatively smaller than that of semiconductor, and thus does not affect the resistance of the semiconductor light-receiving element 200 in its entirety.

Figure 5:
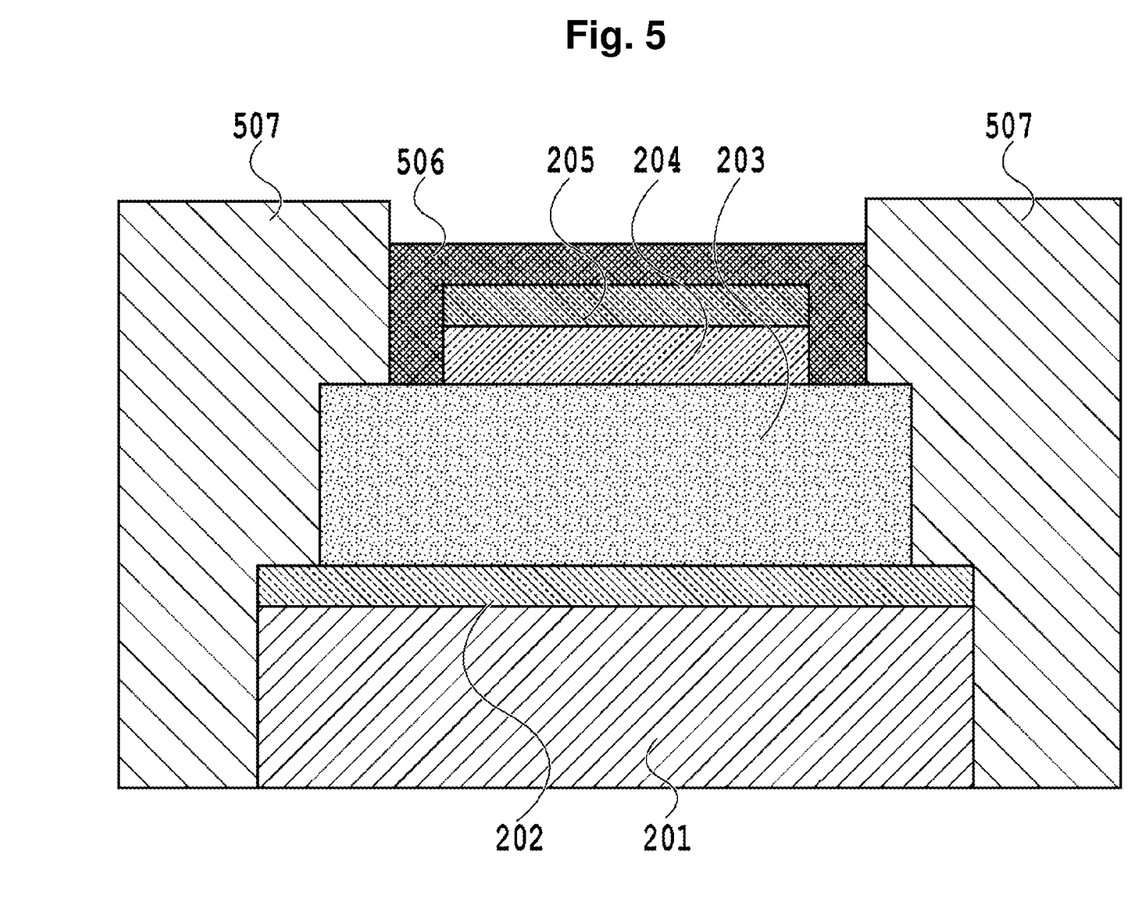
FIG. 5 illustrates a step of manufacturing the semiconductor light-receiving element according to the first embodiment of the present invention.

In this case, as illustrated in FIG. 5, it is unnecessary to form a ring-shaped gap by using a photoresist. It suffices that patterning is carried out to form an electrode 506 by using a photoresist 507 for forming a circular gap around the contact layer 204 of n-type at the center. In the case with this shape, the process margin in the photolithography step can further be increased compared to the case of using the photoresist pattern to form a ring-shaped gap.

For example, a semiconductor light-receiving element with a circular-shaped mesa is considered in which the contact layer 204 of n-type has a diameter of 10 µm. When the conventional ring-shaped electrode 106 in FIG. 1 is assumed to have a width of 2 µm, a mirror to be formed has a diameter of 6 µm. This results in an effective light-receiving diameter of only 6 µm. In contrast, the semiconductor light-receiving element illustrated in the present embodiment can obtain a light-receiving diameter of 10 µm.

As illustrated above, the semiconductor light-receiving element according to the present embodiment can obtain a larger light-receiving diameter even when a light-receiving element has a decreased mesa diameter to increase the operating speed, and can also achieve a high-speed light-receiving element with high sensitivity while increasing the process margin.

In the semiconductor light-receiving element 200 illustrated in the first embodiment, the ring-shaped electrode (metal electrode) 206 is brought into an electrical contact with the side of the contact layer 204 of n-type, so that the metal electrode can be formed without decreasing the area of the upper surface of the mirror film 205.

Note that an electrode (not illustrated) is provided on an end portion of the contact layer 202 of P-type. The contact layer 202 is in contact with the light-absorbing layer 203.

Second Embodiment

Figure 6:
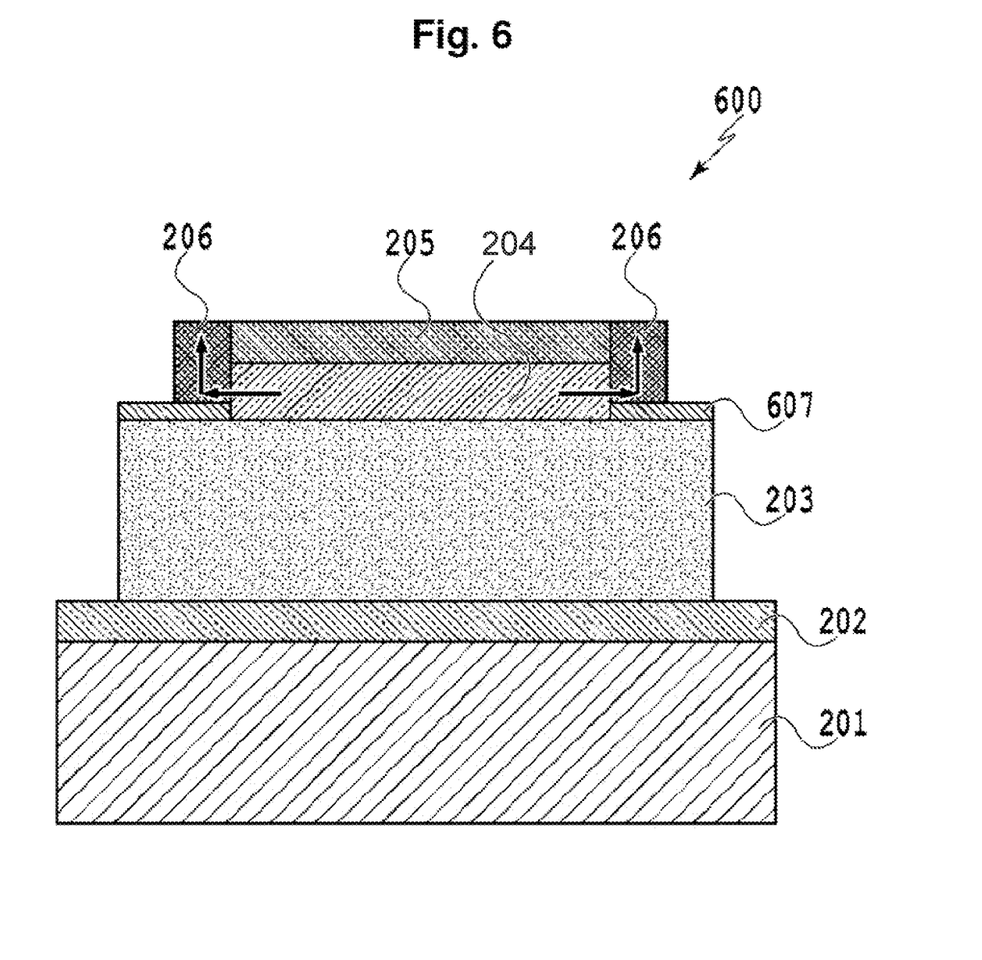
FIG. 6 illustrates a semiconductor light-receiving element according to a second embodiment of the present invention.

FIG. 6 is a cross-sectional structural view of a semiconductor light-receiving element 600 according to a second embodiment. Compared to the first embodiment, the semiconductor light-receiving element 600 according to the present embodiment has a structure in which a semiconductor layer (the light-absorbing layer 203 containing InGaAs) adjacent to the contact layer 204 containing n-type InP, and the metal electrode 206 that is in contact with the contact layer 204 containing n-type InP are isolated from each other by an insulating film 607. The semiconductor light-receiving element 600 according to the present embodiment is characterized in that the metal electrode 206 and the light-absorbing layer 203 containing InGaAs are not in contact with each other on a surface perpendicular to the growth direction, the metal electrode 206 being in contact with the contact layer (semiconductor layer) 204 containing n-type InP on a surface parallel to the growth direction.

In the second embodiment, the insulating film 607 of $SiO_2$ is deposited on the upper surface of the light-absorbing layer 203 containing InGaAs and adjacent to the contact layer 204 containing n-type InP to isolate the light-absorbing layer 203 of InGaAs from the metal electrode 206 that is in contact with the contact layer 204 containing n-type InP, to thereby minimize an increase in parasitic capacitance according to the thickness of the metal electrode.

In a method for manufacturing the semiconductor light-receiving element according to the present embodiment, a mesa of the contact layer 204 of n-type is formed in the same step as illustrated in the first embodiment, and thereafter an insulating film of, for example, $SiO_2$ is formed on the entire surface of a wafer by sputtering. Then, lithography is performed by covering a portion of the wafer, other than the mesa of the contact layer 204 containing n-type InP, with a resist, and then dry etching is performed on the insulating film through the resist pattern to form the insulating film 607. Thereafter, it suffices that the mirror film 205 containing metal and the metal electrode 206 are formed in the same manner as in the first embodiment.

As illustrated above, the semiconductor light-receiving element according to the present embodiment can obtain a larger light-receiving diameter even when a light-receiving element has a decreased mesa diameter to increase the operating speed, and can also achieve a high-speed light-receiving element with high sensitivity while increasing the process margin.

Third Embodiment

Figure 7:
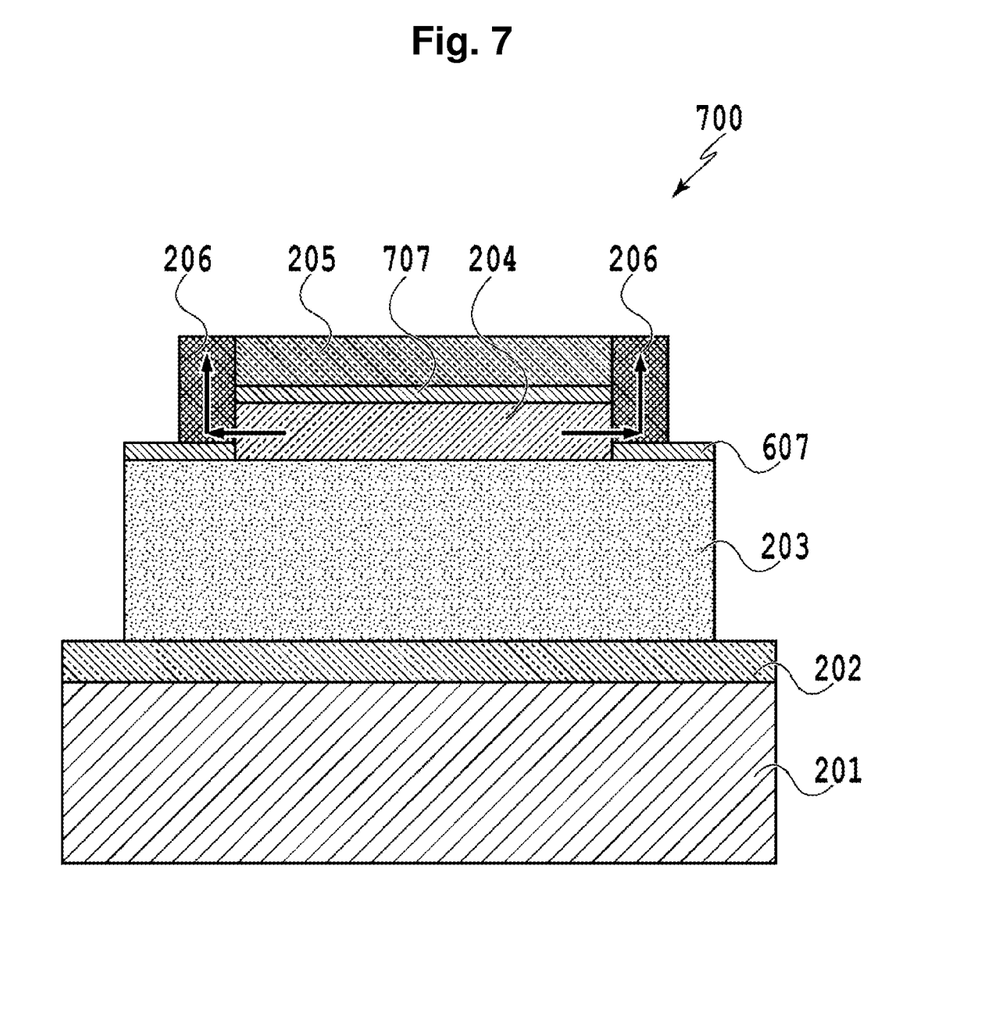
FIG. 7 illustrates a semiconductor light-receiving element according to a third embodiment of the present invention.

Compared to the structure illustrated in the second embodiment, a semiconductor light-receiving element 700 according to the third embodiment has a structure as illustrated in FIG. 7 in which an insulating film 707 is further formed between the mirror film 205 made of metal and the contact layer 204 containing n-type InP, which is a semiconductor contact layer. In this structure, the mirror film 205 containing metal does not come into contact with the contact layer (semiconductor layer) 204 that is in contact with the metal electrode 206.

It suffices that the insulating film 707 is made of, for example, SiN. SiN has better adhesion to both semiconductor and metal, while not sacrificing optical properties. Although an electrical contact from the contact layer 204 containing semiconductor and having a mesa shape to the mirror film 205 containing metal is lost, electrons in the semiconductor light-receiving element 700 are extracted through the metal electrode 206 that is in contact with the side of the contact layer 204 containing n-type InP, similarly to the above embodiments.

In the present embodiment, the contact layer 204 containing n-type InP, and coming into contact with the metal electrode 206 on a surface horizontal to the growth direction of the semiconductor, has a thickness of 0.3 µm. This is because the contact layer 204 ensures a large contact area with the metal electrode 206 to reduce the contact resistance. It is apparent that as the thickness of the contact layer 204 containing n-type InP increases, it is more effective to reduce the contact resistance. Practically, if the contact layer 204 is excessively thick, this may impair the crystal quality of the epilayer. Assuming that a light-receiving element has an operating band of approximately 50 GHz, and the contact layer 204 has a thickness of at least approximately 0.3 µm, then this does not cause serious process effects of the contact resistance.

FIG. 7 illustrates an example of the semiconductor light-receiving element 700 including insulating films, that is, the insulating film 707 and the insulating film 607. However, a semiconductor light-receiving element including an insulating film that is the insulating film 707, so that the light-absorbing layer 203 and the metal electrode 206 come into contact with each other, can also be achieved.

As illustrated above, the semiconductor light-receiving element according to the present embodiment can obtain a larger light-receiving diameter even when a light-receiving element has a decreased mesa diameter to increase the operating speed, and can also achieve a high-speed light-receiving element with high sensitivity while increasing the process margin.

In the first to third embodiments, the circular-shaped mesa and the ring-shaped electrode have been described as an example.

However, it is apparent that the embodiments of the present invention are not limited by the shape of the mesa of semiconductor or the shape of the metal electrode. For example, the mesa may have a quadrangular shape. As for the electrode shape, the generality of the present invention is not lost even if an electrode is formed on a part or a plurality of parts of the side of the mesa.

In all of the embodiments of the present invention, a metal electrode is formed on a surface horizontal to the growth direction of the n-type semiconductor contact layer. However, it is apparent that the present invention can also have the same electrode structure for a p-type semiconductor contact layer.

INDUSTRIAL APPLICABILITY

The present invention is applicable to the technical field that relates to semiconductor light-receiving elements (photodiodes).

REFERENCE SIGNS LIST 100, 200, 600, 700 Semiconductor light-receiving element
101, 201 InP substrate
102, 202 Contact layer
103, 203 Light-absorbing layer
104, 204 Contact layer
105 Reflective mirror
205 Mirror film
106 Ring-shaped electrode
206 Metal electrode
307, 407, 507 Photoresist
607, 707 Insulating film

The invention claimed is:

1. A semiconductor light-receiving element comprising:
a semiconductor layer doped with first impurities;
a semiconductor light-absorbing layer on the semiconductor layer doped with the first impurities, the semiconductor light-absorbing layer having bandgap energy adjusted to absorb incident light;
a semiconductor layer doped with second impurities on the semiconductor light-absorbing layer;
a mirror film containing metal to reflect incident light, on the semiconductor layer doped with the second impurities; and
a metal electrode that comes into contact with a side of the semiconductor layer doped with the second impurities, wherein
the side of the metal electrode is a surface parallel to a growth direction of the semiconductor layer doped with the second impurities.

2. The semiconductor light-receiving element according to claim 1, wherein the metal electrode comes into contact with the semiconductor layer doped with the second impurities on a surface parallel to a growth direction of the semiconductor layer doped with the second impurities, and wherein the metal electrode and the semiconductor light-absorbing layer are not in contact with each other on a surface perpendicular to a growth direction of the semiconductor layer doped with the second impurities.

3. The semiconductor light-receiving element according to claim 1, wherein
if the first impurities are p-type impurities, then the second impurities are n-type impurities, and
whereas if the first impurities are n-type impurities, then the second impurities are p-type impurities.

4. The semiconductor light-receiving element according to claim 1, wherein the mirror film and the metal electrode are in contact with each other.

5. The semiconductor light-receiving element according to claim 4, wherein the mirror film containing metal does not come into contact with a semiconductor layer that is in contact with the metal electrode.

6. The semiconductor light-receiving element according to claim 4, wherein an insulating layer is formed between the mirror film and the semiconductor layer doped with the second impurities.

7. The semiconductor light-receiving element according to claim 1, wherein an insulating layer is formed between the semiconductor light-absorbing layer and the metal electrode.

8. The semiconductor light-receiving element according to claim 1, wherein the metal electrode contains Ti, Pt, and Au.

* * * * *